United States Patent
Rouh et al.

(10) Patent No.: US 8,003,501 B2
(45) Date of Patent: Aug. 23, 2011

(54) METHOD OF DOPING P-TYPE IMPURITY IONS IN DUAL POLY GATE AND METHOD OF FORMING DUAL POLY GATE USING THE SAME

(75) Inventors: Kyoung Bong Rouh, Icheon-si (KR); Seung Mi Lee, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 28 days.

(21) Appl. No.: 12/650,833

(22) Filed: Dec. 31, 2009

(65) Prior Publication Data

US 2010/0317180 A1 Dec. 16, 2010

(30) Foreign Application Priority Data

Jun. 15, 2009 (KR) .................. 10-2009-0053063

(51) Int. Cl.
*H01L 21/42* (2006.01)
*H01L 21/425* (2006.01)

(52) U.S. Cl. ........ 438/513; 438/514; 438/527; 438/529; 438/530

(58) Field of Classification Search .................. None
See application file for complete search history.

(56) References Cited

U.S. PATENT DOCUMENTS

| 4,912,065 | A * | 3/1990 | Mizuno et al. ............... 438/301 |
|---|---|---|---|
| 6,815,271 | B2 * | 11/2004 | Zhang ........................... 438/154 |
| 7,067,367 | B2 | 6/2006 | Lee et al. |
| 2006/0141690 | A1 * | 6/2006 | Jin et al. ........................ 438/199 |
| 2009/0035886 | A1 * | 2/2009 | Ellis-Monaghan et al. .... 438/57 |
| 2009/0061602 | A1 | 3/2009 | Lee et al. |
| 2010/0120240 | A1 * | 5/2010 | Rouh et al. ................... 438/595 |

FOREIGN PATENT DOCUMENTS

| KR | 10-2001-0004934 | 1/2001 |
|---|---|---|
| KR | 10-2007-0047639 | 5/2007 |

* cited by examiner

*Primary Examiner* — Scott B Geyer
(74) *Attorney, Agent, or Firm* — Marshall, Gerstein & Borun LLP

(57) ABSTRACT

A method of doping p-type impurity ions in a dual poly gate, comprising: forming a polysilicon layer doped with n-type impurity ions on a substrate with a gate insulation layer being interposed between the polysilicon layer and the substrate; exposing a region of the polysilicon layer; implementing a first doping of p-type impurity ions into the exposed region of the polysilicon layer by ion implantation so with a projection range Rp to a predetermined depth of the polysilicon layer; and implementing a second doping of p-type impurity ions into the exposed region of the polysilicon layer doped with the p-type impurity ions by plasma doping with a sloped doping profile.

9 Claims, 4 Drawing Sheets

Doping of p-type impurity ions
(Plasma doping method)

Annealing (RTP)

METHOD OF DOPING P-TYPE IMPURITY IONS IN DUAL POLY GATE AND METHOD OF FORMING DUAL POLY GATE USING THE SAME

CROSS-REFERENCE TO RELATED APPLICATION

Priority to Korean patent application number 10-2009-0053063 filed Jun. 15, 2009, the entire disclosure of which is incorporated by reference, is claimed.

BACKGROUND OF THE INVENTION

The invention relates generally to a method of fabricating a semiconductor device and, more particularly, to a method of doping p-type impurity ions in a dual poly gate and a method of forming a dual poly gate using the same.

As the degree of integration of semiconductor devices has increased, use of a complementary metal oxide semiconductor (CMOS) transistor in which a p-type MOS transistor and an n-type MOS transistor are disposed on the same substrate has gradually widened. In a general CMOS transistor, the p-type MOS transistor has a buried channel structure. In the case of the buried channel structure, increase in degree of integration of a device leads to a decrease in channel length, which in turn leads to an increase in the influence of an applied electric field, consequently resulting in deterioration of leakage current properties. Accordingly, a dual gate structure is employed to form a p-type MOS transistor of a surface channel structure. In a dual gate structure, a p-type impurity region, e.g., a p-type gate implanted with boron (B) is disposed in a region formed with the p-type MOS transistor, and an n-type impurity region, e.g., an n-type gate implanted with phosphorus (P) is disposed in a region formed with the n-type MOS transistor.

In a conventional method of forming the dual gate structure, a gate insulation layer is formed on a semiconductor substrate and a polysilicon layer is formed thereon as a gate conductive layer. N-type impurity ions are doped when forming the polysilicon layer. Next, an ion implantation process using a photoresist layer pattern, which exposes the p-type MOS transistor region, is used to implant the p-type impurity ions into a portion of the polysilicon layer corresponding to the p-type MOS transistor region. The p-type impurity ions are implanted using plasma doping. By such ion implantation, the conductivity type of the polysilicon layer in the p-type MOS transistor region is converted from an n-type into a p-type. After that, a diffusion of the impurity ions by a thermal process is implemented to form an n-type conductive poly gate in the n-type MOS transistor region and a p-type conductive poly gate in the p-type MOS transistor region.

FIGS. 1A and 1B are graphs showing concentration profiles of p-type impurity ions using the plasma doping method. Specifically, FIG. 1A is a graph showing variation in concentration profile according to increase in energy, and FIG. 1B is a graph showing variation in concentration profile according to increase in ion (i.e., impurity) dosage. As indicated by an arrow 110 in FIG. 1A, a concentration profile is such that implanted ion concentration on the surface does not vary (see "A" in FIG. 1A) but slope varies as energy is increased. Also, as indicated by an arrow 120 in FIG. 1B, the concentration profile is such that implanted ion concentration uniformly increases as dosage increases.

As described above, when using the plasma doping method, it is not easy to make a uniform implanted ion concentration profile in the polysilicon layer. One cause of this problem is that there is no projected range Rp, i.e., a mean penetration depth of impurity ions, in the plasma doping method. Since it is difficult to properly adjust the doping profile as described above, deterioration of poly depletion rate (PDR) in the p-type MOS transistor region occurs when the concentration of the p-type impurity ions is low, particularly in a portion adjacent to a gate insulation layer. The deterioration of the poly depletion rate property exhibits the same effect as an increase in a thickness of a gate oxide layer, which deteriorates operation properties of a device. When increasing energy or concentration of the p-type impurity ions in a portion adjacent to the gate insulation layer to restrict this phenomenon, a problem can occur in that the depth to which the p-type impurity ions penetrate increases and the p-type impurity ions thus penetrate into the gate insulation layer under the polysilicon layer as indicated by "B" in FIGS. 1A and "C" in FIG. 1B.

SUMMARY OF THE INVENTION

Embodiments of the invention are directed to a method of doping p-type impurity ions in a dual poly gate, which adjust a doping profile of the p-type impurity ions in a p-type poly gate to restrict deterioration of the poly depletion rate property without penetration of the p-type impurity ions into a gate insulation layer, and a method of forming a dual poly gate using the same.

In one embodiment, a method of doping p-type impurity ions in a dual poly gate comprises: forming a polysilicon layer doped with n-type impurity ions on a substrate with a gate insulation layer being interposed between the polysilicon layer and the substrate; exposing a region of the polysilicon layer; implementing a first doping of p-type impurity ions into the exposed region of the polysilicon layer by an ion implantation method with a projection range Rp to a predetermined depth of the polysilicon layer; and implementing a second doping of p-type impurity ions into the exposed region of the polysilicon layer doped with the p-type impurity ions by a plasma doping method with a sloped doping profile in the polysilicon layer.

Preferably, boron (B) ions are used as the p-type impurity ions.

Preferably, the first doping is implemented with energy and an impurity dosage selected such that the p-type impurity ions do not penetrate into the gate insulation layer.

Preferably, the method further comprises: annealing to diffuse the p-type impurity ions in the projection range Rp to a lower portion of the polysilicon layer. Preferably, annealing is implemented using a rapid thermal process.

In another embodiment, a method of forming a dual poly gate comprises: forming a gate insulation layer on a substrate having an n-type region on which an n-type poly gate is disposed and a p-type region on which a p-type poly gate is disposed; forming a polysilicon layer doped with n-type impurity ions on the gate insulation layer; exposing a portion of the polysilicon layer corresponding to the p-type region; implementing a first doping of p-type impurity ions into the exposed portion of the polysilicon layer corresponding to the p-type region by an ion implantation method with a projection range Rp to a predetermined depth of the polysilicon layer; implementing a second doping of p-type impurity ions into the exposed portion of the polysilicon layer corresponding to the p-type region and doped with the p-type impurity ions by plasma doping with a sloped doping profile in the polysilicon layer; and annealing to diffuse the p-type impurity ions in the projection range Rp to a lower portion of the polysilicon layer.

Preferably, phosphorus (P) ions are used as the n-type impurity ions and boron (B) ions are used as the p-type impurity ions.

Preferably, the first doping is implemented with energy and an impurity dosage selected such that the p-type impurity ions do not penetrate into the gate insulation layer.

Preferably, annealing is implemented using a rapid thermal process.

In accordance with the invention, by implementing the doping of the p-type impurity ions in two steps using an ion implantation method capable of adjusting a doping concentration in a predetermined region in the polysilicon layer, and implementing the doping using a plasma doping method, it is possible to restrict deterioration of the poly depletion rate while preventing penetration of the impurity ions into the gate insulation layer.

DESCRIPTION OF SPECIFIC EMBODIMENTS

Preferred embodiments of the invention are described in detail below with reference to the accompanying drawings.

FIGS. 2 through 5 are sectional views illustrating a method of doping p-type impurity ions in a dual poly gate and a method of forming a dual poly gate in accordance with an embodiment of the invention. FIG. 6 is a graph illustrating a doping profile of p-type impurity ions by steps.

Figure 1A:
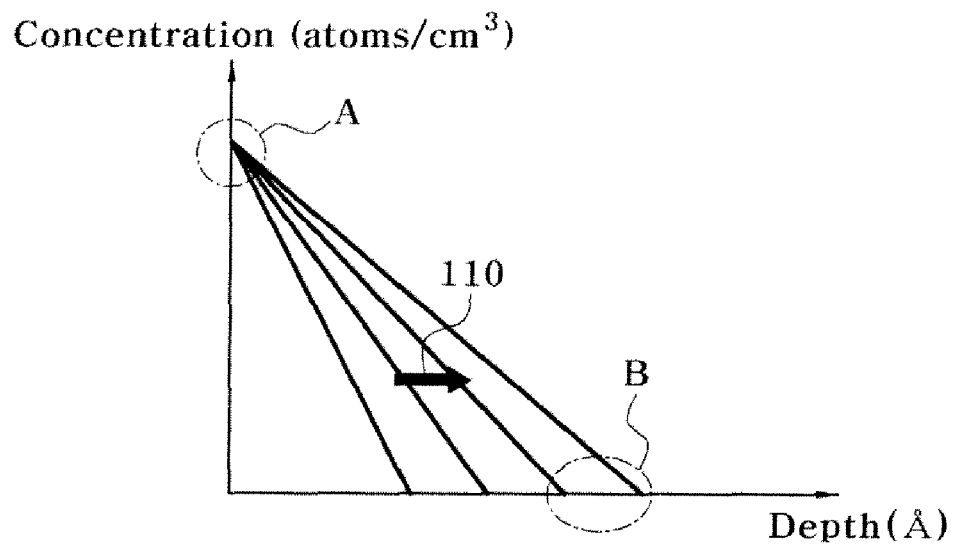
FIGS. 1A and 1B are graphs showing concentration profiles of p-type impurity ions using a prior art plasma doping method.
Figure 1B:
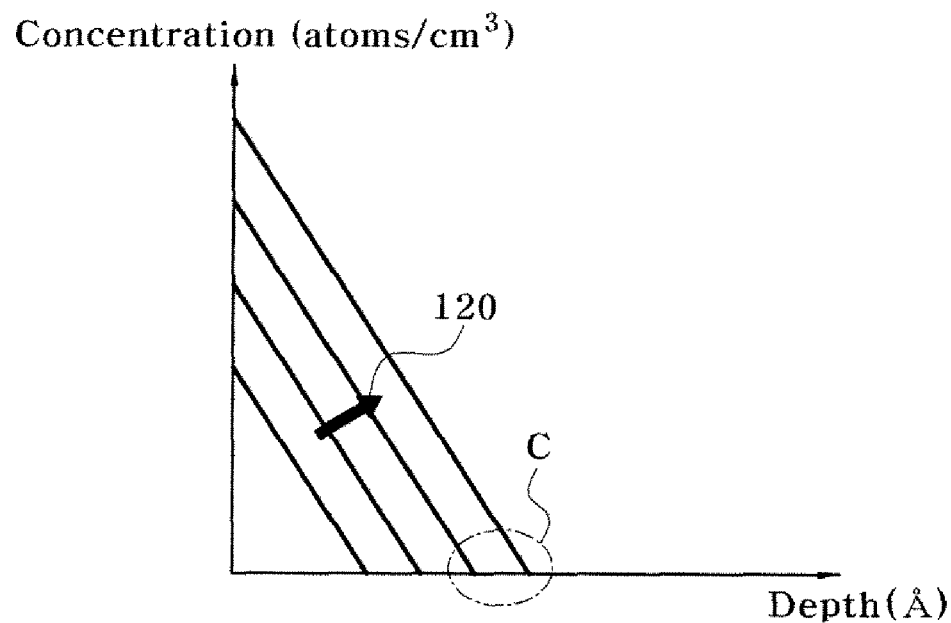
Figure 2:
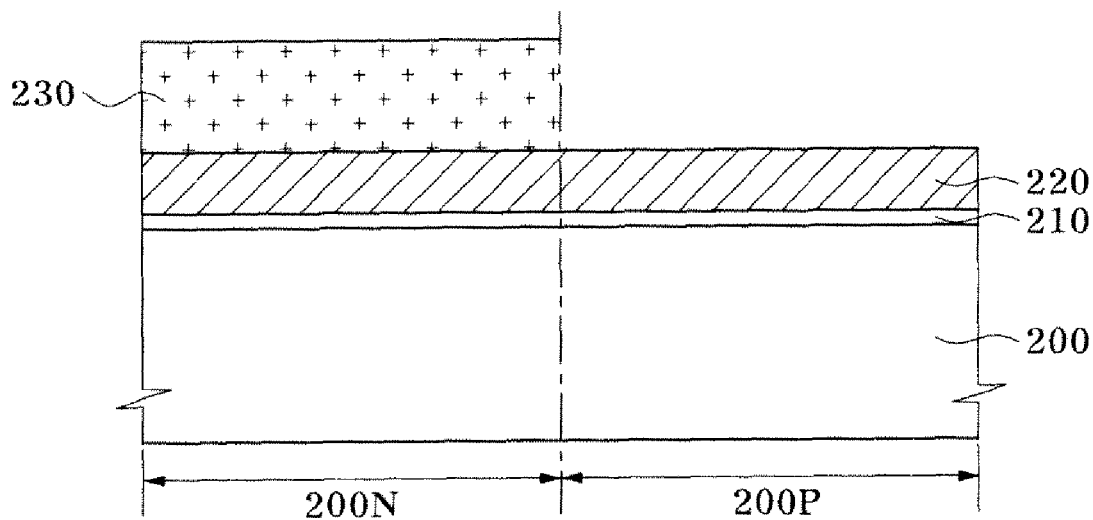
FIGS. 2 through 5 are sectional views illustrating a method of doping p-type impurity ions in a dual poly gate and a method of forming a dual poly gate using the same in accordance with an embodiment of the invention.

Referring first to FIG. 2, a gate insulation layer 210 is formed on a substrate 200, preferably a silicon substrate. The substrate 200 has an n-type region 200N and a p-type region 200P. The n-type region 200N is a region where an n-type MOS transistor is disposed, i.e. a region to be formed with an n-type poly gate, and the p-type region 200P is a region where a p-type MOS transistor is disposed, i.e. a region to be formed with a p-type poly gate. The gate insulation layer 210 preferably is a silicon oxide layer, but is not limited thereto.

After the gate insulation layer 210 is formed, a polysilicon layer 220 doped with n-type impurity ions is formed on the gate insulation layer 210 as a gate conductive layer. While phosphorus (P) is illustratively used as the n-type impurity ions, other n-type conductive ions may be used if necessary or desired. Doping of the n-type impurity ions on the polysilicon layer 220 preferably is implemented through a separate n-type impurity ion doping process after deposition of the polysilicon layer, or by depositing the polysilicon layer 220 while doping the n-type impurity ions.

Next, a mask layer pattern 230 that covers a portion of the polysilicon layer 220 corresponding to the n-type region 200N and exposes a portion of the polysilicon layer 220 corresponding to the p-type region 200P is formed. The mask layer pattern 230 is used as an ion implantation mask and preferably comprises a photoresist layer.

Figure 3:
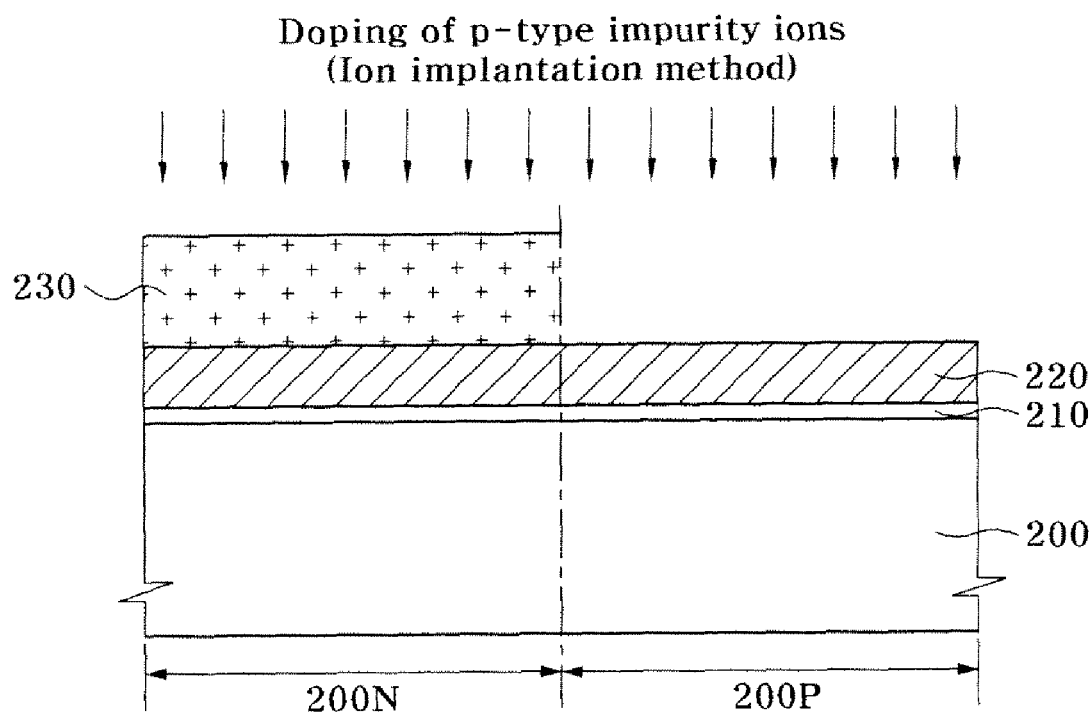

Referring next to FIGS. 3 and 6, a first doping step of doping the p-type impurity ions is implemented on the exposed portion of the polysilicon layer 220 in the p-type region 200P using an ion implantation method, i.e., a method of implementing a doping process using a conventional ion implantation apparatus. Boron (B) ion preferably is used as the p-type impurity ion. When doping the p-type impurity ions by this ion implantation method, a profile having a projection range Rp that shows the maximum concentration (indicated by "a" in FIG. 6) at a certain depth is formed as indicated by a reference numeral 610 in FIG. 6. Also, a maximum depth (indicated by "b" in FIG. 6) is the maximum depth that does not allow penetration of the boron (B) ions into the gate insulation layer 210.

According to this concentration profile, the boron (B) ions in a surface portion of the polysilicon layer 220, at which the maximum concentration (a) is exhibited, diffuse to a lower portion of the polysilicon layer 220 through a subsequent diffusion process to increase the concentration in a region adjacent to the gate insulation layer 210 in the entire region of the polysilicon layer 220, thereby restricting deterioration of a poly depletion rate. Also, since the boron (B) ions do not penetrate well into the gate insulation layer 210 through diffusion, penetration of the boron (B) ions into the gate insulation layer 210 is avoided during this step.

Figure 4:
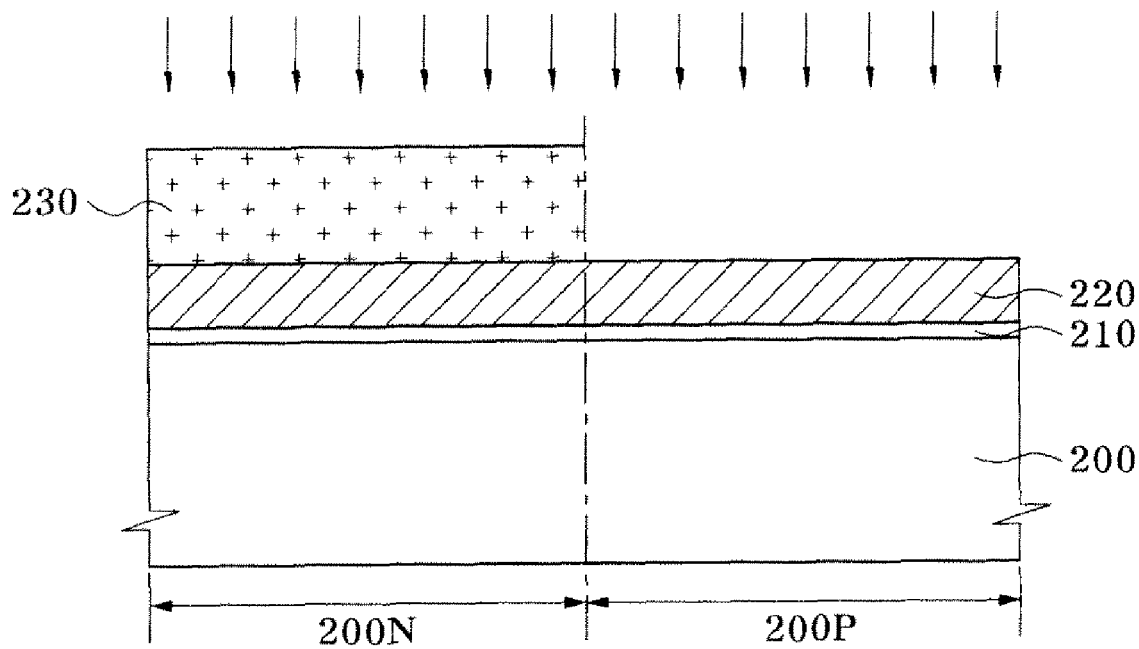

Referring next to FIG. 4, a second doping step of doping p-type impurity ions is implemented on the exposed portion of the polysilicon layer 220 in the p-type region 200P, preferably using a plasma doping method, i.e., a method of implementing a doping process using a plasma doping chamber wherein plasma is excited in a reaction space and then implanted using the plasma. Boron (B) ion preferably is used as the p-type impurity ion.

When doping the p-type impurity ions by this plasma doping method, a sloped doping profile in an inverse proportion to depth of doping is exhibited as indicated by a reference numeral 620 in FIG. 6. Doping energy or impurity ion dosage is properly adjusted upon doping of the boron (B) ions by the plasma doping method so that penetration of the boron (B) ions into the gate insulation layer 210 is avoided. In this case, although the doping concentration in the lower portion of the polysilicon layer 220 is reduced, the doping concentration of the boron (B) ions reduced in the lower portion of the polysilicon layer 220 is compensated for as the boron (B) ions implanted by ion implantation method diffuse to the lower portion of the polysilicon layer 220 in the subsequent diffusion process, as described above with reference to FIG. 2.

Figure 5:
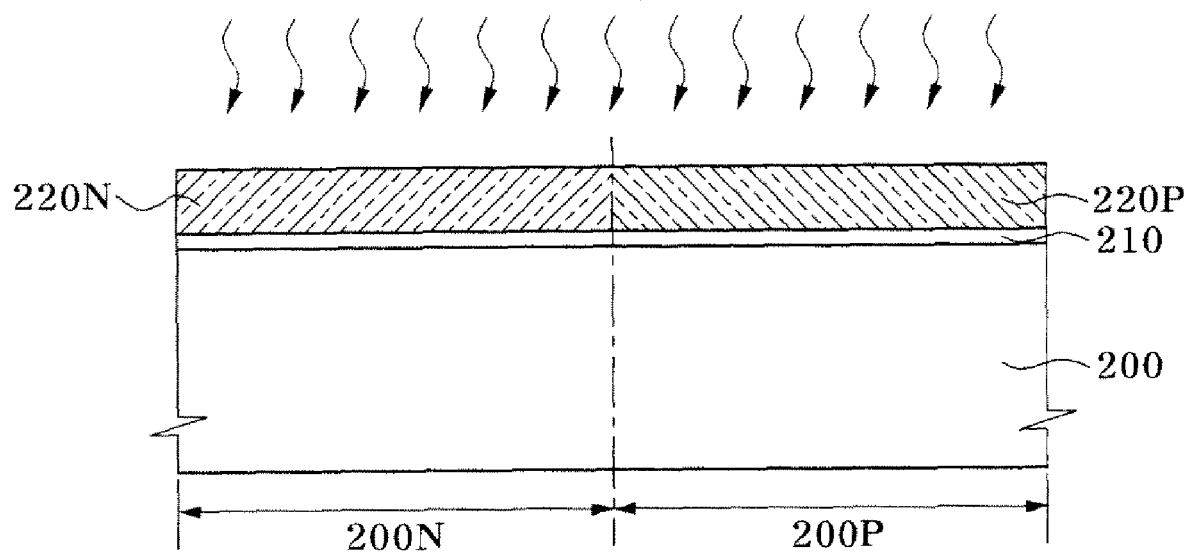
Figure 6:
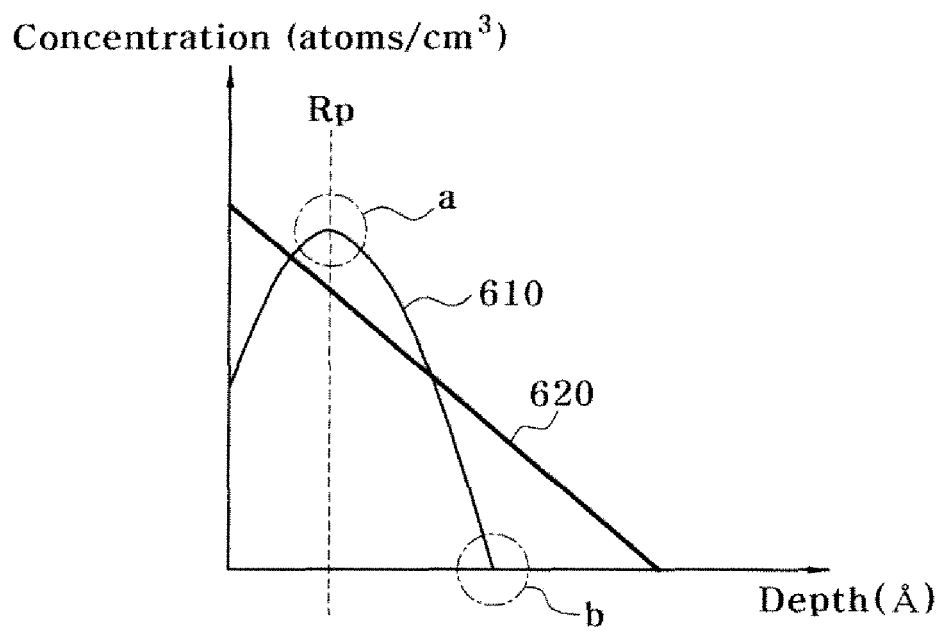
FIG. 6 is a graph illustrating a doping profile of p-type impurity ions by steps according to the invention.

Referring next to FIG. 5, the mask layer pattern (230 of FIG. 4) is removed to expose the entire surface of the polysilicon layer (220 of FIG. 4) on the n-type region 200N and the p-type region 200N. Next, annealing is implemented to diffuse the n-type impurity ions and the p-type impurity ions implanted into the polysilicon layer (220 of FIG. 4). Annealing preferably is performed in a rapid thermal process. By annealing, the n-type region 200N is formed with an n-type poly gate 220N doped with the n-type impurity ions and the p-type region 200P is formed with a p-type poly gate 220P doped with the p-type impurity ions.

Figure 7:
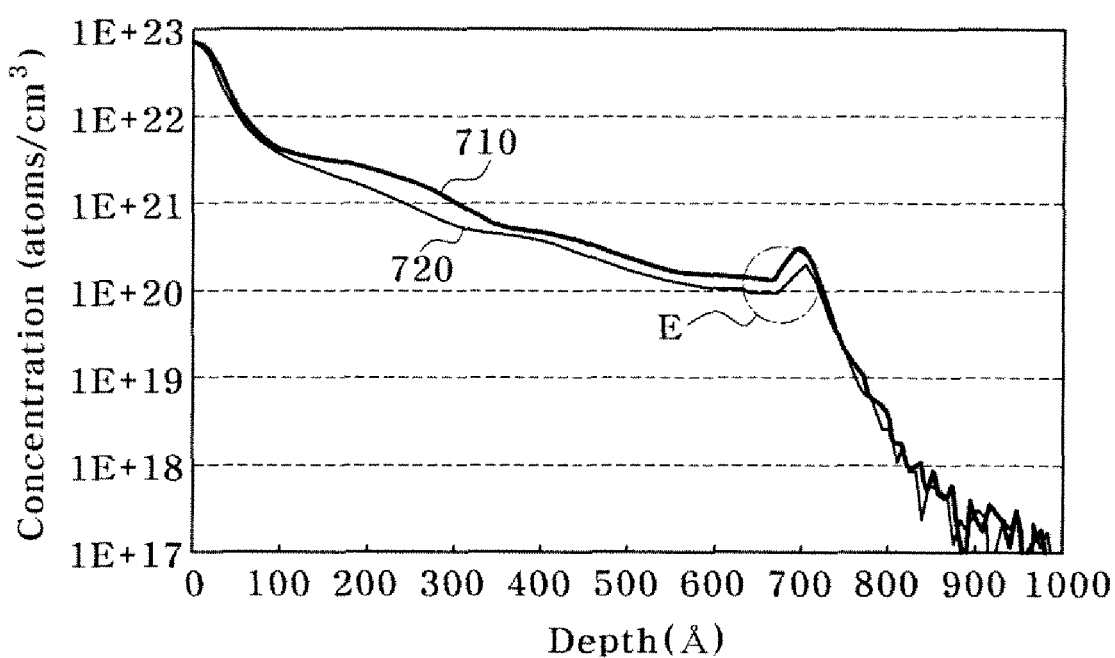
FIG. 7 is a graph illustrating comparison of a concentration profile of boron (B) impurity ions doped in accordance with an embodiment of the invention with a prior art concentration profile.

FIG. 7 is a graph illustrating comparison of a concentration profile of boron (B) ions doped in accordance with an embodiment of the invention with a prior art profile. A line indicated by a reference numeral 710 in FIG. 7 is a concentration profile after doping the boron (B) ions using the ion implantation method and plasma doping method and implementing the annealing in accordance with an embodiment of the invention. A line indicated by a reference numeral 720 is a concentration profile after doping the boron (B) ions using the plasma doping method alone and implementing the annealing in accordance with the prior art. As can be seen from the FIG. 7, a difference in the concentration is not large. Particularly, the concentration in a portion indicated by "E" in the figure, i.e. a lower portion of the polysilicon layer adjacent to the gate insulation layer, is relatively high in the inventive embodiment, and it can accordingly be appreciated that the poly depletion property of the p-type poly gate is enhanced as compared to that of the prior art.

While the invention has been described with respect to the specific embodiments, various changes and modifications may be made without departing from the spirit and scope of the invention as defined in the following claims.

What is claimed is:

1. A method of doping p-type impurity ions in a dual poly gate, comprising:
    forming a polysilicon layer doped with n-type impurity ions on a substrate with a gate insulation layer being interposed between the polysilicon layer and the substrate;
    exposing a region of the polysilicon layer;
    implementing a first doping of p-type impurity ions into the exposed region of the polysilicon layer by ion implantation with a projection range Rp to a predetermined depth of the polysilicon layer; and
    implementing a second doping of p-type impurity ions into the exposed region of the polysilicon layer doped with the p-type impurity ions by plasma doping with a sloped doping profile in the polysilicon layer.

2. The method of claim 1, wherein the p-type impurity ions comprise boron (B) ions.

3. The method of claim 1, comprising implementing the first doping with energy and an impurity dosage selected such that the p-type impurity ions do not penetrate into the gate insulation layer.

4. The method of claim 1, further comprising: annealing to diffuse p-type impurity ions in the projection range Rp to a lower portion of the polysilicon layer.

5. The method of claim 4, comprising annealing by a rapid thermal process.

6. A method of forming a dual poly gate, comprising:
    forming a gate insulation layer on a substrate that has an n-type region on which an n-type poly gate is disposed and a p-type region on which a p-type poly gate is disposed;
    forming a polysilicon layer doped with n-type impurity ions on the gate insulation layer;
    exposing a portion of the polysilicon layer corresponding to the p-type region;
    implementing a first doping of p-type impurity ions into the exposed portion of the polysilicon layer corresponding to the p-type region by ion implantation with a projection range Rp to a predetermined depth of the polysilicon layer;
    implementing a second doping of p-type impurity ions into the exposed portion of the polysilicon layer that corresponds to the p-type region and is doped with the p-type impurity ions by plasma doping with a sloped doping profile in the polysilicon layer; and
    annealing to diffuse p-type impurity ions in the projection range Rp to a lower portion of the polysilicon layer.

7. The method of claim 6, wherein the n-type impurity ions comprise phosphorus (P) ions and the p-type impurity ions comprise boron (B) ions.

8. The method of claim 6, comprising implementing the first doping with such energy and an impurity dosage selected such that the p-type impurity ions do not penetrate into the gate insulation layer.

9. The method of claim 6, comprising annealing by a rapid thermal process.

* * * * *